US012755296B2

(12) United States Patent
Ishigaki

(10) Patent No.: US 12,755,296 B2
(45) Date of Patent: Oct. 6, 2026

(54) SYSTEMS AND METHODS FOR IDENTIFYING A REUSE VALUE OF USED BATTERY USING A RESIDUAL VALUE AND MARKET DATA

(71) Applicant: Toyota Motor Engineering & Manufacturing North America, Inc., Plano, TX (US)

(72) Inventor: Masanori Ishigaki, Ann Arbor, MI (US)

(73) Assignees: Toyota Motor Engineering & Manufacturing North America, Inc.a, Plano, TX (US); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 19/084,172

(22) Filed: Mar. 19, 2025

(65) Prior Publication Data

US 2026/0289600 A1 Sep. 24, 2026

(51) Int. Cl.
*G06Q 30/0201* (2023.01)
*G01R 31/392* (2019.01)

(52) U.S. Cl.
CPC ....... *G06Q 30/0206* (2013.01); *G01R 31/392* (2019.01)

(58) Field of Classification Search
CPC .......................... G06Q 30/0206; G01R 31/392
See application file for complete search history.

(56) References Cited

U.S. PATENT DOCUMENTS 6,045,941 A 4/2000 Milewits
6,433,513 B1 8/2002 Hayashi
6,781,344 B1 8/2004 Hedegor et al.
(Continued)

FOREIGN PATENT DOCUMENTS

CN 1437031 A 8/2003
CN 205484728 U 8/2016
(Continued)

OTHER PUBLICATIONS

Umamaheswari Janakiraman et al "ReviewâLithium Plating Detection Methods in Li-Ion Batteries" 2020 J. Electrochem. Soc. 167160552 (available at: https://iopscience.iop.org/article/10.1149/1945-7111/abd3b8/meta) (Year: 2020).*
(Continued)

*Primary Examiner* — Rupangini Singh
*Assistant Examiner* — Stephanie S. Wallick
(74) *Attorney, Agent, or Firm* — Christopher G. Darrow; Darrow Mustafa PC

(57) ABSTRACT

Systems, methods, and other embodiments described herein relate to estimating a residual value using derivative computations of a safety state and utilizing market data for identifying the reuse value. In one embodiment, a method includes removing interference sources by computing first derivatives of real-parts from measured impedance of a used battery. The method also includes estimating a residual value from a safety state and a health state derived with changes of the first derivatives. The method also includes identifying a reuse value using the residual value and market data. The method also includes installing the used battery to a device according to the reuse value.

20 Claims, 4 Drawing Sheets

(56) References Cited

U.S. PATENT DOCUMENTS

| | | | | |
|---|---|---|---|---|
| 8,407,018 | B2 | 3/2013 | White et al. | |
| 8,519,715 | B2 | 8/2013 | Toomre et al. | |
| 8,696,785 | B2 | 4/2014 | Iida | |
| 8,784,140 | B2 | 7/2014 | Park et al. | |
| 11,043,823 | B2 | 6/2021 | Matthews et al. | |
| 11,072,258 | B2 | 7/2021 | Kumar et al. | |
| 11,160,314 | B2 | 11/2021 | Watanabe et al. | |
| 11,626,628 | B1 | 4/2023 | Budan et al. | |
| 11,802,916 | B2 | 10/2023 | Chung et al. | |
| 11,835,583 | B1 | 12/2023 | Katrasnik et al. | |
| 11,955,610 | B2 | 4/2024 | Börger et al. | |
| 12,174,597 | B2 | 12/2024 | Wolkoff | |
| 2004/0024546 | A1 | 2/2004 | Richter | |
| 2013/0085696 | A1* | 4/2013 | Xu | B60L 58/16 702/63 |
| 2013/0158755 | A1 | 6/2013 | Tang et al. | |
| 2014/0079969 | A1 | 3/2014 | Greening et al. | |
| 2016/0011274 | A1 | 1/2016 | Morita et al. | |
| 2016/0197382 | A1* | 7/2016 | Sood | B60L 58/21 73/620 |
| 2016/0231386 | A1 | 8/2016 | Sung et al. | |
| 2017/0285107 | A1* | 10/2017 | Gholam-Abbas | G01R 31/392 |
| 2018/0074130 | A1 | 3/2018 | Jeung et al. | |
| 2020/0363344 | A1 | 11/2020 | Heo et al. | |
| 2021/0066945 | A1* | 3/2021 | Jung | H02J 7/0048 |
| 2021/0088592 | A1* | 3/2021 | Uchida | G06Q 30/0278 |
| 2021/0249702 | A1 | 8/2021 | Murphy et al. | |
| 2022/0163597 | A1* | 5/2022 | Munakata | H02J 7/005 |
| 2022/0187376 | A1* | 6/2022 | Simonis | G01R 31/007 |
| 2022/0336859 | A1 | 10/2022 | Jang | |
| 2023/0126838 | A1 | 4/2023 | Sharma et al. | |
| 2023/0296684 | A1* | 9/2023 | Stefanopoulou | G01R 31/3865 702/60 |
| 2023/0318066 | A1 | 10/2023 | Williams et al. | |
| 2023/0387483 | A1 | 11/2023 | Murphy et al. | |
| 2023/0387487 | A1 | 11/2023 | Liaw et al. | |
| 2024/0044827 | A1 | 2/2024 | Ishigaki et al. | |
| 2024/0094297 | A1 | 3/2024 | Kabra et al. | |
| 2024/0120763 | A1* | 4/2024 | Hong | H02J 7/005 |
| 2024/0201274 | A1 | 6/2024 | Ishigaki et al. | |
| 2024/0230778 | A1* | 7/2024 | Sarlashkar | G01R 31/3842 |
| 2024/0280539 | A1* | 8/2024 | Yun | G01R 31/396 |
| 2024/0295610 | A1 | 9/2024 | Fleischer et al. | |
| 2024/0308388 | A1 | 9/2024 | Bilby et al. | |
| 2024/0385250 | A1* | 11/2024 | Yoshida | H01M 10/48 |
| 2024/0429476 | A1* | 12/2024 | Akutsu | H01M 10/48 |
| 2025/0130287 | A1* | 4/2025 | Shimizu | H01M 10/482 |
| 2025/0291001 | A1* | 9/2025 | Cheng | G01R 31/58 |

FOREIGN PATENT DOCUMENTS

| | | | | |
|---|---|---|---|---|
| CN | 106461732 | A | 2/2017 | |
| CN | 105015360 | B | 7/2017 | |
| CN | 206331098 | U | 7/2017 | |
| CN | 107037363 | A | 8/2017 | |
| CN | 107533105 | A | 1/2018 | |
| CN | 108099667 | A | 6/2018 | |
| CN | 106291378 | B | 11/2018 | |
| CN | 109238608 | A | 1/2019 | |
| CN | 109786898 | A | 5/2019 | |
| CN | 110556597 | A | 12/2019 | |
| CN | 111082165 | A | 4/2020 | |
| CN | 112213658 | A * | 1/2021 | G01R 31/388 |
| CN | 112698212 | A | 4/2021 | |
| CN | 114355211 | A | 4/2022 | |
| CN | 217034192 | U | 7/2022 | |
| CN | 115534682 | A | 12/2022 | |
| CN | 115561641 | A | 1/2023 | |
| CN | 116050275 | A | 5/2023 | |
| CN | 116774044 | A | 9/2023 | |
| CN | 117148157 | A | 12/2023 | |
| CN | 117471346 | A | 1/2024 | |
| CN | 117741446 | A | 3/2024 | |
| CN | 118478740 | A | 8/2024 | |
| CN | 118625158 | A | 9/2024 | |
| CN | 118759393 | A | 10/2024 | |
| EP | 2979101 | A1 | 2/2016 | |
| EP | 2990818 | A2 | 3/2016 | |
| EP | 3674730 | A1 | 7/2020 | |
| EP | 2530482 | B1 | 3/2024 | |
| JP | 2019035596 | A | 3/2019 | |
| JP | 6907066 | B2 | 7/2021 | |
| KR | 20070061301 | A | 6/2007 | |
| KR | 20140131079 | A | 11/2014 | |
| KR | 2064745 | B1 | 1/2020 | |
| KR | 20240077618 | A | 6/2024 | |
| WO | 2014154462 | A1 | 10/2014 | |
| WO | 2014156869 | A1 | 10/2014 | |
| WO | 2015031437 | A1 | 3/2015 | |
| WO | 2022063236 | A1 | 3/2022 | |
| WO | 2022153874 | A1 | 7/2022 | |
| WO | 2022264898 | A1 | 12/2022 | |
| WO | 2022265121 | A1 | 12/2022 | |
| WO | 2023026839 | A1 | 3/2023 | |
| WO | 2023031501 | A1 | 3/2023 | |
| WO | 2023174895 | A1 | 9/2023 | |
| WO | 2023229906 | A1 | 11/2023 | |
| WO | 2024127132 | A1 | 6/2024 | |
| WO | 2024176637 | A1 | 8/2024 | |
| WO | 2024187283 | A1 | 9/2024 | |

OTHER PUBLICATIONS

Galeotti et al., "Performance analysis and SOH (state of health) evaluation of lithium polymer batteries through electrochemical impedance spectroscopy," Energy, vol. 89, 2015, pp. 678-686.

Ishigaki et al., "Operando Li metal plating diagnostics via MHz band electromagnetics," Nat Commun 14, 7275, 2023, pp. 1-9.

Zhou et al., "Learning operando impedance function for battery health with aging-aware equivalent circuit model," arXiv:2407.06639, Jul. 14, 2024, pp. 1-11.

Fu et al., "Transfer Learning and Vision Transformer based State-of-Health prediction of Lithium-Ion Batteries," arXiv:2209.05253, Sep. 7, 2022, pp. 1-13.

Lee et al., "Fast State-of-Health Estimation Method for Lithium-ion Battery using Sparse Identification of Nonlinear Dynamics," arXiv:2410.16749, Oct. 22, 2024, pp. 1-6.

Reshma et al., "Collaborative evaluation of SoC, SoP and SoH of lithium-ion battery in an electric bus through improved remora optimization algorithm and dual adaptive Kalman filtering algorithm," Journal of Energy Storage, vol. 68, 2023, pp. 1-16.

Cabrera-Castillo et al., "Calculation of the state of safety (SOS) for lithium ion batteries," Journal of Power Sources, vol. 324, Aug. 2016, 42 pages.

Romain Wenzel, "State-of-safety (SoS) data-driven assessment for utility-scale lithiumion operating BESS," Degree project in Energy Technology, 2nd cycle, 2023, 95 pages.

Mattia et al., "A low-cost approach to on-board electrochemical impedance spectroscopy for a lithium-ion battery," Journal of Energy Storage, vol. 81, Jul. 27, 2023, pp. 1-14.

Zhu et al., "End-of-life or second-life options for retired electric vehicle batteries," Cell Reports Physical Science, vol. 2, Feb. 17, 2016, pp. 1-26.

Schlasza et al., "Review on the aging mechanisms in Li-ion batteries for electric vehicles based on the FMEA method," 2014 IEEE Transportation Electrification Conference and Expo (ITEC), Jun. 1, 2014, pp. 1-6.

Park et al., "Review of state-of-the-art battery state estimation technologies for battery management systems of stationary energy storage systems," Journal of Power Electronics, vol. 20, Mar. 4, 2020, pp. 1526-1540.

Bosello et al., "To Charge or to Sell? EV Pack Useful Life Estimation via LSTMs, CNNs, and Autoencoders," Energies, vol. 16, No. 6, Mar. 1, 2023, pp. 1-17.

Bolun Xu, "Dynamic Valuation of Battery Lifetime," IEEE Transactions on Power Systems, vol. 37, No. 3, Sep. 28, 2021, pp. 2177-2186.

(56) References Cited

OTHER PUBLICATIONS

Feng et al., "Adapting Amidst Degradation: Cross Domain Li-ion Health Estimation via Physics Guided Test-Time Training," found at https://arxiv.org/abs/2402.00068, submitted Nov. 19, 2024, pp. 1-12.
Cogneville et al., "Battery Valuation on Electricity Intraday Markets with Liquidity Costs," found at https://arxiv.org/abs/2412.15959, submitted Dec. 20, 2024, pp. 1-21.
Gu et al., "Challenges and Opportunities for Second-life Batteries: A Review of Key Technologies and Economy," found at https://arxiv.org/abs/2308.06786, submitted Aug. 13, 2023, pp. 1-37.
Dongwoo et al., "Fast State-of-Health Estimation Method for Lithium-ion Battery using Sparse Identification of Nonlinear Dynamics," found at https://arxiv.org/abs/2410.16749, submitted Oct. 22, 2024, pp. 1-6.
"Battery Cell, Module, or Pack: What's the difference?" found at https://www.renogy.com/blog/how-to-distinguish-battery-cells-battery-modules-and-battery-packs#:~: text=Each%20component%20serves%20a%20unique,deliver%20power%20to%20the%20device., Aug. 20, 2024, 12 pages.
Electrochemical Impedance Spectroscopy EIS, found at https://cleanenergywiki.org/index.php?title=Electrochemical_Impedence_Spectroscopy_EIS, last visited Dec. 24, 2024, 5 pages.
Unknown, "Battery managment system," found at https://en.wikipedia.org/wiki/Battery_management_system, last accessed on Feb. 8, 2025, 7 pages.
Unknown, "Battery pack," found at https://en.wikipedia.org/wiki/Battery_pack, Jan. 2, 2025, 6 pages.
Kulkarni et al., "Computationally Efficient Machine-Learning-Based Online Battery State of Health Estimation," arXiv:2406.06151, Available at https://arxiv.org/abs/2406.06151, Jun. 10, 2024, pp. 1-17.
Allam et al., "Online capacity estimation for lithium-ion battery cells via an electrochemical model-based adaptive interconnected observer," in IEEE Transactions on Control Systems Technology, vol. 29, No. 4, Jul. 2021, pp. 1636-1651.
Song et al., "Individual cell fault detection for parallel-connected battery cells based on the statistical model and analysis," 2020 American Control Conference (ACC), Denver, CO, USA, 2020, pp. 1155-1160.
Liu et al., "Hybrid Fusion for Battery Degradation Diagnostics Using Minimal Real-World Data: Bridging Laboratory and Practical Applications," arXiv:2410.06469, Available at https://arxiv.org/abs/2410.06469, Oct. 9, 2024, pp. 1-27.
Son et al., "Model-based Stochastic Fault Detection and Diagnosis for Lithium-ion Batteries," Processes 2019, vol. 7, issue 1, pp. 1-19.
Li et al., "Predicting Battery Lifetime Under Varying Usage Conditions from Early Aging Data," vol. 5, issue 4, Apr. 17, 2024, pp. 1-22.
Yi et al., "Bias-Compensated State of Charge and State of Health Joint Estimation for Lithium Iron Phosphate Batteries," arXiv:2401.08136, Available at https://arxiv.org/abs/2401.08136, Mar. 12, 2024, pp. 1-9.
Paulson et al., "Prognosis of Multivariate Battery State of Performance and Health via Transformers," Sep. 18, 2023, pp. 1-33.

* cited by examiner

SYSTEMS AND METHODS FOR IDENTIFYING A REUSE VALUE OF USED BATTERY USING A RESIDUAL VALUE AND MARKET DATA

TECHNICAL FIELD

The subject matter described herein relates, in general, to identifying a reuse value of a used battery, and, more particularly, to estimating a residual value using derivative computations of a safety state and utilizing market data for identifying the reuse value.

BACKGROUND

An electric vehicle (EV) powered with a battery is a clean and efficient alternative to using fossil fuels during travel. Electric motors using battery energy can also reduce maintenance costs and exhibit superior handling that improve consumer satisfaction. However, solutions for retiring a vehicle battery at an end-of-life (EoL) encounter difficulties. In particular, disposing of the vehicle battery harms the environment due to metallic materials. For instance, lithium-ion batteries in a landfill expose chemicals including cobalt, nickel, and manganese to the soil and water. Liquid electrolytes such as lithium-ion can be a fire hazard in landfills and recycling facilities. As such, the EoL of the battery from an EV can hamper and conflict with environmental benefits.

Systems may repurpose and reuse a vehicle battery at the EoL associated with second-life applications. For example, a vehicle battery produces sufficient power as a backup source for residential applications although being unsuitable for vehicle usage. However, reasonable wear and internal degradation to the vehicle battery during primary deployment can impact health and limit reuse applications. For instance, systems testing the vehicle battery for plating as internal degradation encounter difficulties since plating occurs microscopically within cells. This can demand systems utilizing specialized and expensive equipment. Thus, systems repurposing a vehicle battery for second-life can be hindered from physical and chemical breakdown that are costly and difficult to detect, thereby increasing environmental harm and increasing hazards for reuse opportunities.

SUMMARY

In one embodiment, example systems and methods relate to estimating a residual value using derivative computations of a safety state and utilizing market data for identifying a reuse value. In various implementations, systems analyze a traction battery from an electric vehicle (EV), a house, etc., at an end-of-life (EoL) for second-life applications. These batteries can have limited applications from degradation caused by cycling and recharging and damage during travel (e.g., collisions, road debris, etc.). Such events can create safety hazards during reuse. Furthermore, systems forgo reusing a traction battery and recycle the traction battery from unknown defects and internal degradation exhibiting difficult detectability. Internal degradation includes metallic plating occurring during battery charging where lithium ions deposit as metallic lithium on an anode. Plating can significantly degrade battery performance by reducing the available lithium for energy storage, increase internal resistance, and increase safety hazards from short circuits.

Therefore, in one embodiment, an estimation system estimates a reuse value for a used battery from a vehicle through factoring market data and estimating a residual value. Here, the reuse value can be a resale price, a resale value, a resale cost, etc., associated with the used battery. In one approach, the estimation system diagnoses a safety state and a health state during residual value computations and identifies second-life applications without impedance tracking. This allows detecting of a residual and reuse value about the used battery originating from various manufacturers and vehicle makers. Furthermore, the estimation system removes certain interference sources to measure internal resistance at the module level. In this way, downstream systems can factor the residual value and the reuse values when installing the used battery in a device, thereby improving reuse applications.

In one embodiment, an estimation system that estimates a residual value using derivative computations of a safety state and utilizes market data for identifying a reuse value is disclosed. The estimation system includes a memory with instructions, that when executed by a processor, cause the processor to remove interference sources by computing first derivatives of real-parts from measured impedance of a used battery. The instructions also include instructions to estimate a residual value from a safety state and a health state derived with changes of the first derivatives. The instructions also include instructions to identify a reuse value using the residual value and market data. The instructions also include instructions to install the used battery to a device according to the reuse value.

In one embodiment, a non-transitory computer-readable medium that estimates a residual value using derivative computations of a safety state and utilizes market data for identifying a reuse value and including instructions that when executed by a processor cause the processor to perform one or more functions is disclosed. The instructions include instructions to remove interference sources by computing first derivatives of real-parts from measured impedance of a used battery. The instructions also include instructions to estimate a residual value from a safety state and a health state derived with changes of the first derivatives. The instructions also include instructions to identify a reuse value using the residual value and market data. The instructions also include instructions to install the used battery to a device according to the reuse value.

In one embodiment, a method for estimating a residual value using derivative computations of a safety state and utilizing market data for identifying a reuse value is disclosed. In one embodiment, the method includes removing interference sources by computing first derivatives of real-parts from measured impedance of a used battery. The method also includes estimating a residual value from a safety state and a health state derived with changes of the first derivatives. The method also includes identifying a reuse value using the residual value and market data. The method also includes installing the used battery to a device according to the reuse value.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
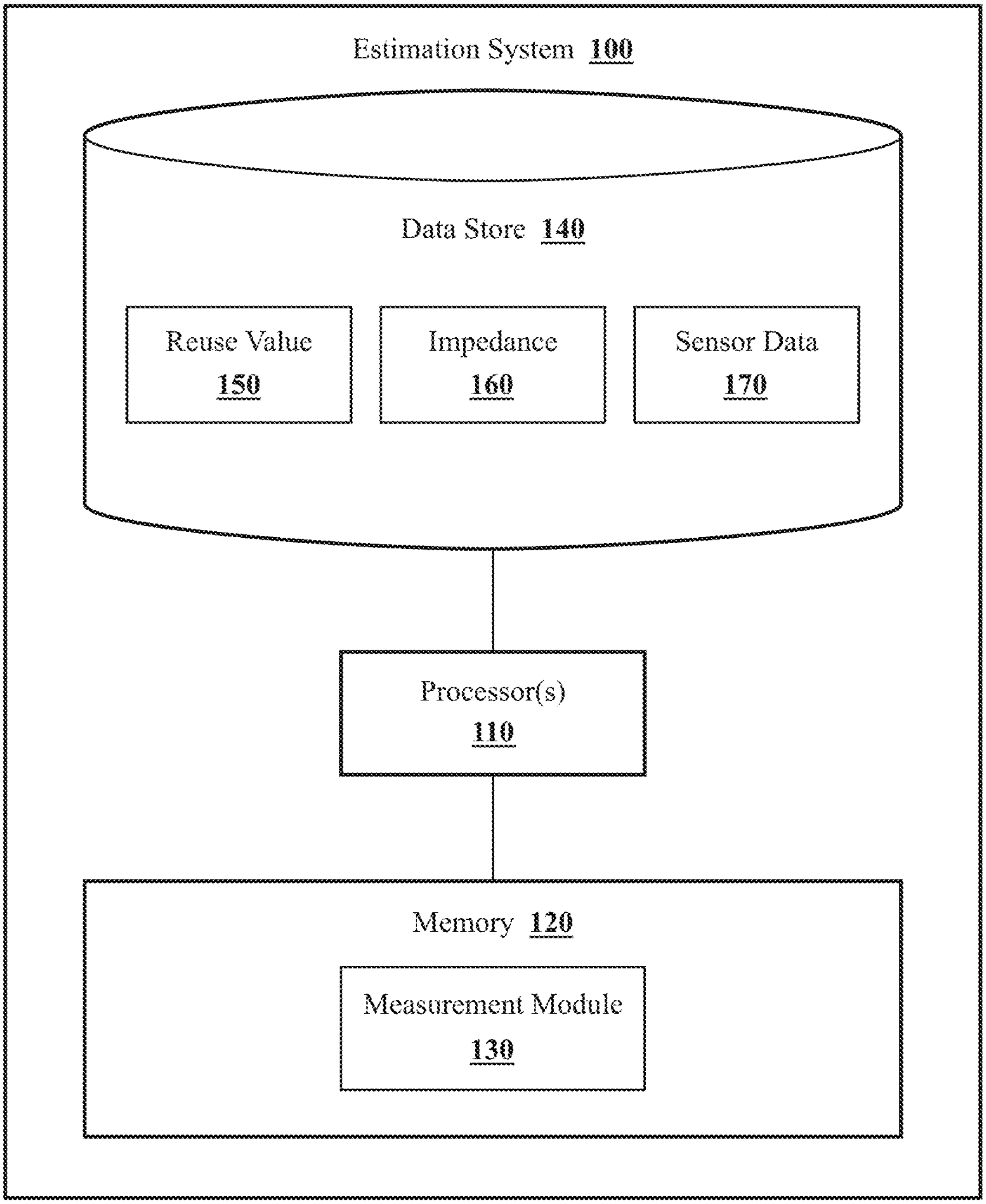
FIG. 1 illustrates one embodiment of an estimation system that is associated with estimating a residual value using derivative computations of a safety state and utilizing market data for identifying a reuse value about a used battery.

Systems, methods, and other embodiments associated with estimating a residual value using derivative computations of a safety state and utilizing market data for identifying a reuse value are disclosed herein. In various implementations, systems testing health and safety conditions associated with used batteries involve sophisticated equipment. For instance, a lithium battery powering an electric vehicle (EV) encounters metallic plating with a superficial layer of lithium ions accumulating on an anode surface. The lithium ions can interfere with current output. Metallic plating occurs in a battery pack from the EV having increased charging rates and exposure to low temperatures. High frequency-electrochemical impedance spectroscopy (HF-EIS) equipment testing and measuring cell-level plating for systems can detect battery degradation (e.g., contact interference, metal plating, etc.) from metallic materials (e.g., lithium-ion). This equipment is costly and detection tasks have difficulties when detecting plating since a battery has tightly integrated hardware and cells with limited direct access. Correspondingly, plating detection becomes more complicated than other defects (e.g., electrical shorts) within internal circuitry. In another example, disassembling the battery pack for diagnosing plating by scanning electron microscopy (SEM) and nuclear magnetic resonance (NMR) damages internal sensors, controllers, cell packaging, etc. As such, directly accessing cells through disassembly can involve tasks that damage the used battery, thereby precluding reuse applications and downstream tasks demanding health and safety information about the used battery.

In another approach, systems measuring parameters at a module level encounter difficulties associated with interference from structural changes in the battery pack. A structural change can be one of case deformations, accidental damage, and physical holes. Accordingly, systems testing a used battery for safety conditions and estimating a residual value have challenges with detection technologies involving sophisticated equipment and invasive disassembly, thereby hindering reuse applications.

Therefore, in one embodiment, an estimation system processes collected data for various used batteries after primary implementations, estimates a residual value from safety and health states, and outputs a reuse value. Here, the reuse value can be a resale price, a resale value, etc., associated with the used battery. Estimating the residual value can involve removing interference sources by computing first derivatives of real-parts from measured impedance of the used battery. This allows accurate computations for a safety state at a module level instead of cells, thereby reducing testing complexity. In one approach, the estimation system factors a health state (e.g., a remaining capacity, a charging capacity, etc.) and market data and estimates the residual value when computing the reuse value associated with the used battery. Furthermore, downstream systems can select the used battery for installing in a device (e.g., a home, a vehicle, etc.) according to the reuse value. This may involve deriving the reuse value with the used battery having plating that is above a threshold and installing the used battery for non-critical applications accordingly. Therefore, the estimation system reliably and efficiently estimates a residual value and a reuse value for second-life applications associated with a used battery.

In certain implementations, the systems illustrated in FIGS. 1-4 also include various elements. It will be understood that in various embodiments, the systems may have less than the elements shown in FIGS. 1-4. The systems can have any combination of the various elements shown in FIGS. 1-4. Furthermore, the systems can have additional elements to those shown in FIGS. 1-4. In some arrangements, the systems may be implemented without one or more of the elements shown in FIGS. 1-4. While the various elements are shown as being located within the systems in FIGS. 1-4, it will be understood that one or more of these elements can be located external to the systems. Furthermore, the elements shown may be physically separated by large distances. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

With reference to FIG. 1, one embodiment of an estimation system 100 of FIG. 1 is further illustrated. The estimation system 100 includes a memory 120 that stores a measurement module 130. The memory 120 is a random-access memory (RAM), a read-only memory (ROM), a hard-disk drive, a flash memory, or other suitable memory for storing the measurement module 130. The measurement module 130 is, for example, computer-readable instructions that when executed by the processor(s) 110 cause the processor(s) 110 to perform the various functions disclosed herein. The measurement module 130 can acquire data from testing equipment, testing sensors, etc., about a used battery associated with identifying a reuse application. This includes the testing equipment measuring impedance using hardware that applies a minimal alternating current (AC) signal into a module, cell, etc., and measures the response. Such testing equipment can precisely output detailed information about the internal resistance and reactance of a battery, such as a high-voltage battery used by an EV.

In various implementations, systems monitoring, identifying, etc., internal growth of Li-metal deposition are vital for deriving and identifying a state of safety (SOS) of the lithium-ion batteries. This allows reducing thermal runaway temperature of lithium-ion batteries, thereby increasing reuse applications that are safe. Along these lines, the estimation system 100 and the measurement module 130 can measure impedance for a used battery by testing equipment with a target temperature and a target state of charge (SOC). For example, the target temperature and the target SOC are associated with levels exhibiting robust chemical activity of the used battery. As further explained below, the estimation system 100 removes interference sources by computing first derivatives of real-parts from the impedance. This allows the estimation system 100 to output a safety state indicating metallic plating, a residual value (e.g., remaining functionality, power reliability, etc.), and a reuse value about the used battery at the module level while avoiding impedance tracking.

In another example, impedance tracking can demand a system measuring impedance to acquire internal sensor data that is unavailable from third-party manufacturers during testing. Impedance tracking can also involve accessing manufacturing details and schematics that are proprietary, thereby having limited access.

As explained in detail below, the estimation system 100 estimates the residual value from the safety state and a health state derived with changes of the first derivatives within a frequency band for the used battery. For example, the frequency band is above a frequency having increased chemical breakdown and an ion (e.g., lithium-ion) response that is elevated and robust for testing the used battery. Upon the residual value satisfying a parameter, other systems can reuse the used battery to power a device. For instance, the estimation system 100 transmits the residual value to a device and the device draws power from the used battery during a reuse operation upon the residual value satisfying a parameter.

In another embodiment, the measurement module 130 generally includes instructions that function to control the processor(s) 110. The estimation system 100 also can include a data store 140. In one embodiment, the data store 140 is a database. The database is, in one embodiment, an electronic data structure stored in the memory 120 or another data store and that is configured with routines that can be executed by the processor(s) 110 for analyzing stored data, providing stored data, organizing stored data, and so on. Thus, in one embodiment, the data store 140 stores data used by the measurement module 130 in executing various functions. In one embodiment, the data store 140 further includes reuse value 150 and impedance 160. For example, the reuse value 150 can be a resale price, a resale value, a resale cost, etc., associated with the used battery. Furthermore, battery characteristics associated with the reuse value 150 can include the safety state that indicates plating within a cell, a cell array (e.g., twelve cells), a module, etc., internal to the used battery and a frequency band where the plating is prominent.

The safety state can involve extracting operating qualities over certain safety-related features of the used battery (e.g., SOC, temperature, induction, etc.). In this regard, a quality such as plating can involve forming a metallic layer on an anode surface of the cell from improper intercalation of lithium ions into anode material and the lithium ions accumulating on the anode surface. Here, the frequency band can be above a frequency having increased chemical breakdown and an ion response that is elevated associated with the used battery. The battery characteristics can also include a parameter associated with the safety state indicating that one of a cell and the module internal within the used battery has undetected plating on a surface of an anode associated with a threshold (e.g., a current output, a voltage output, etc.).

In another example, the aforementioned battery characteristics include a SOC that is one of a charge level and a discharge level associated with chemical degradation. Furthermore, the battery characteristics can include a functionality state for the used battery using the safety state and the health state. For instance, the functionality state can be a residual value of the used battery as a power source in a reuse application. As further explained below, the residual value or the functionality state can be directly correlated with the safety state and the health state for the used battery. In one approach, the estimation system 100 outputs the residual value by multiplying values of the safety state and the health state and identifies the reuse value with the residual value. In this way, systems can utilize the outputs to identify lithium deposition that makes the used battery unsafe for second-life applications and potential reuse opportunities from the residual and reuse values.

In FIG. 1, the impedance 160 can include a measure of the opposition to current, electrical, energy, etc., flow expressed using complex-valued generalization and Ohm (2) units. In these respects, impedance is similar to resistance in direct current (DC) systems. In AC systems, impedance incorporates reactance due to frequency-dependent contributions from capacitance and inductance. As such, impedance in an AC system is still measured in Q units by the equation $Z=V/I$ having V and I that are frequency-dependent.

The estimation system 100, in one embodiment, includes testing equipment that measures impedance at a module level for the used battery and executes computations involving first derivatives of the impedance. This allows removing interference sources having first derivative properties for impedance that are one of unchanged, negligible (e.g., zero), linear, etc. This also facilitates estimating a residual value from a health state and a safety state for one or more cells within a module of the used battery without invasive disassembly and expensive diagnostic equipment, thereby reducing system complexity.

In various embodiments, the estimation system 100 and the measurement module 130 are further configured to include instructions that cause the processor 110 to remove interference sources by computing first derivatives of real-parts from measured impedance of a used battery. As further explained below, the interference sources can be an inductive interference from iron and a contact interference associated with one of a cell and a module within the used battery. The estimation system 100 also can estimate a residual value from a safety state and a health state derived with changes of the first derivatives. Furthermore, the estimation system 100 can identify a reuse value using the residual value and market data. In one approach, the estimation system 100 and downstream applications (e.g., second life) install the used battery to a device according to the reuse value.

In yet another example, deriving the market data can involve the estimation system 100 collecting usage data, resale trends, etc., about multiple batteries after a primary use. For instance, the resale trend can be region-specific (e.g., North America, Europe, Asia, etc.), country-specific, climate-specific (e.g., an Arctic climate, a tropical climate, a multi-season climate, etc.). This can include using data from public datasets, fleet data, etc. The estimation system 100 can output the market data utilizing the usage data and factor the data for computing a relative reuse value.

Residual value computations can also involve computing eddy interference for the interference sources using a linear relationship derived from the first derivatives. Furthermore, as previously described, the estimation system 100 detects plating of a terminal within the used battery by comparing a difference between two values of a first derivative with a threshold without disassembling cells associated with the used battery. This allows the estimation system 100 to calculate the safety state and associated reuse value using a degree of the plating independent of a visual inspection, thereby simplifying and automating testing.

In one approach, estimating the residual value involves the measurement module 130 measuring the health state using acquired sensor data 170 about the used battery with testing equipment. Here, the sensor data 170 includes an output voltage, an operating temperature, and the impedance at reduced temperatures. As explained below, the estimation system 100 can output the residual value by multiplying values of the safety state, the health state, and a weighting factor associated with an internal structure about the used battery. The health state can be a state of health (SOH) that indicates one of a remaining capacity and a charging capacity of the used battery. Furthermore, the estimation system 100 can label a characteristic of the safety state as one of material wear and an eddy current from inductive interference. For example, the material wear includes solid electrolyte interphase (SEI) growth on a battery cell associated with the used battery.

In the forthcoming examples, the residual value is one of a state of functionality and a state of function (SOF) associated with the used battery. This can include the residual value indicating a degree of the used battery available as a power source in a reuse application. Meanwhile, the safety state may indicate plating within a cell of a module internal to the used battery. The estimation system 100 can incorporate the safety state when deriving a reuse value for a used battery.

In yet another embodiment, the estimation system 100 compares a plating degree to a threshold that varies between applications. The threshold can depend upon environmental and stress conditions of the application. Certain applications demand a used battery being free of plating and below the threshold. For instance, vehicles cannot be protected from fire hazards of a plated battery when encountering a serious collision. Home applications can reuse the used battery with minimal plating above the threshold instead of recycling since the used battery is less likely to encounter a hazard. As such, the estimation system 100 can derive the reuse value even with the plating that is above a threshold.

The estimation system 100 includes instructions that cause the processor 110 to detect physical and chemical changes about the internal state of a battery (e.g., a lithium-ion battery) from impedance measurements using the measurement module 130. For instance, a frequency band for impedance measurements exceeds a frequency (e.g., 100 Hz, 1 kHz, 1 MHz, etc.) where the ion response inside the battery is dominant. This allows the estimation system 100 to accurately diagnose causes of impedance changes from impedance values with variable frequencies $f_1$ to $f_2$ and a first derivative for a frequency.

A diagnosis associated with degradation can include one of a safety state, the existence of lithium metal deposition, lithium plating inside at least one cell of a battery and a residual value. The diagnosis assists with identifying a reuse application by the estimation system 100. For instance, the reuse application is one of an industrial reuse, a residential reuse, and a commercial reuse for the used battery. The residual value exceeding a minimal parameter, threshold, etc., can indicate that one or more cells within the used battery exhibit sparse plating or lack metallic plating, thereby increasing opportunities for reuse and resale rather than recycling and creating waste. Otherwise, the residual value may indicate one of the used battery being unsuitable and unsafe for reuse opportunities, the used battery has limited market value, and the used battery should be recycled.

As previously explained, different degrees of the residual value can indicate available applications for reuse and improve reuse value estimates. For instance, an average residual value and market value can indicate that the used battery can be reliably used as a backup source for a building (e.g., a warehouse, a house, etc.). This application may have reduced demands for safety and quality of service (QoS) and environmental pressures for a used battery having minimal plating. Meanwhile, critical applications can demand the residual value that is elevated for the used battery. This can include the used battery being a main power source for a traction battery associated with a vehicle, hospitals, powering medical equipment, a power source for a chemical plant, etc.

In another approach, the SOF weights a SOS with a SOH and forms Equation (1):

$$SOF = \alpha x SOH x SOS. \quad \text{Equation (1)}$$

Here, the variable α can be a weighting factor that can depend upon one of a battery chemistry, a cellular structure, casing material, application environment, usage environment (e.g., commercial backup, an electric vehicle), etc. In this respect, the variable α improves reuse and resale determinations by incorporating and factoring additional context to SOF for the used battery. For example, the estimation system 100 computes a functionality state, SOF, etc., for the used battery using the safety state and the weighting factor, and the SOH. Thus, the functionality state can indicate a residual value of the used battery as a power source for various reuse applications and associated resale computations.

The SOH can be reuse-dependent using classes and indicate one of a remaining capacity and a charging capacity of the used battery in Equation (1). In one instance, a class for vehicle reuse demands an elevated SOH (e.g., 90%) for charging capacity while residential reuse can tolerate a lower SOH (e.g., 80%). Highly critical installations such as hospitals may demand a SOH above 95%. In one approach, the estimation system 100 derives the SOH using output voltage, average operating temperature, and impedance from the average temperatures. As such, the estimation system 100 can reliably output one of a safety state that indicates degradation such as metallic plating and a residual value for the used battery. This allows related systems to automatically identify that the used battery is viable for reuse, compute reuse values, and assign the used battery to particular applications. Otherwise, a downstream system generates a recycling plan from the output since the used battery is one of defective, worn beyond repair, and exhibits limited market value.

In various implementations, the estimation system 100 measuring impedance at target temperatures and SOCs parameters and frequency bands improves the effectiveness of plating detection, computing a safety state, and deriving a residual value using first derivative computations. These parametric targets can depend upon the internal architecture, cell layout (e.g., stacked layers, parallel, rolled cells, etc.) and chemistry profile of a used battery. As such, the estimation system 100 can adapt these parametric targets during impedance measurement involving the used battery which further improves computational accuracy.

In another implementation, the estimation system 100 selects a frequency band according to a cell layout and internal architecture (e.g., cylindrical cells, stacked sheets, etc.) of a used battery. As previously explained, the frequency band can be associated with the testing equipment measuring impedance from the used battery when the ion response internally at a cell is dominant. Furthermore, the estimation system 100 and the measurement module 130 can filter wear interference and measurement noise (e.g., sensor interference) to the used battery using the frequency band. Accordingly, the estimation system 100 can at a module level diagnose causes of impedance changes from measurements and real-parts of a first derivative for a cell accurately while reducing testing and computational complexity.

Figure 2A:
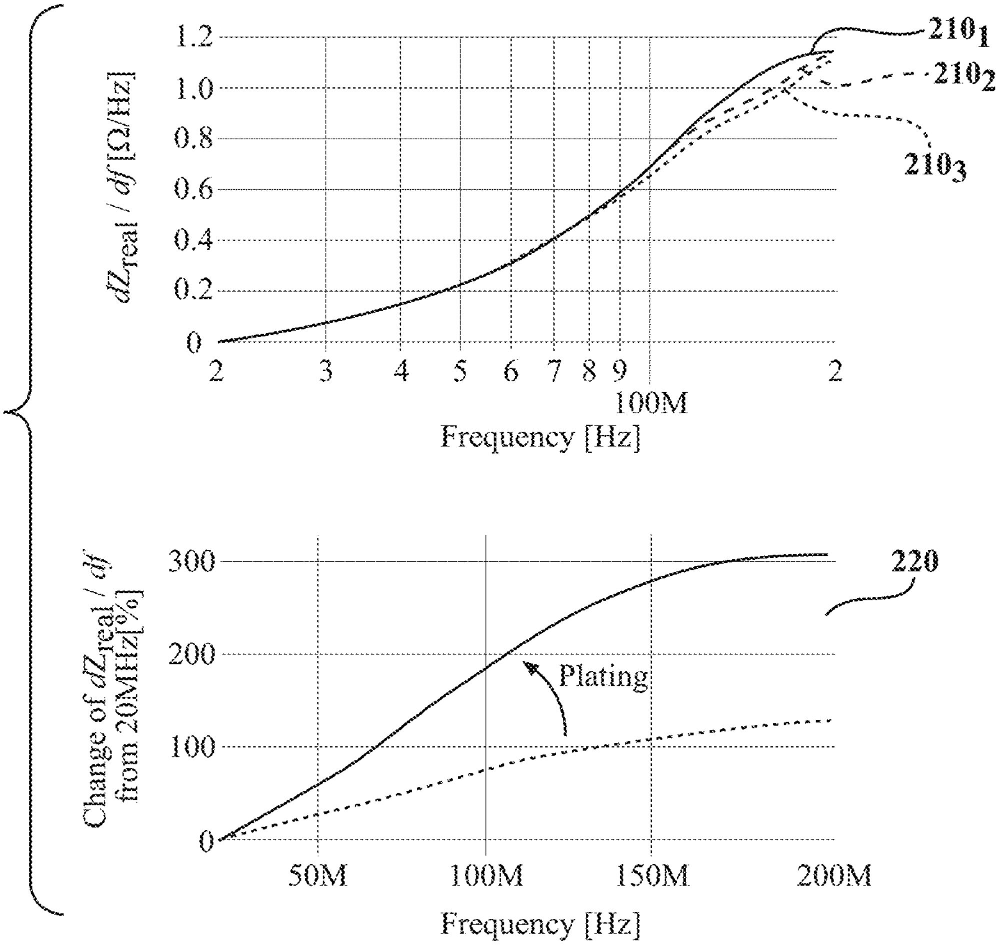
FIGS. 2A and 2B illustrate examples of detecting plating, measuring a health state, and predicting the residual value and the reuse value for the used battery.
Figure 2B:
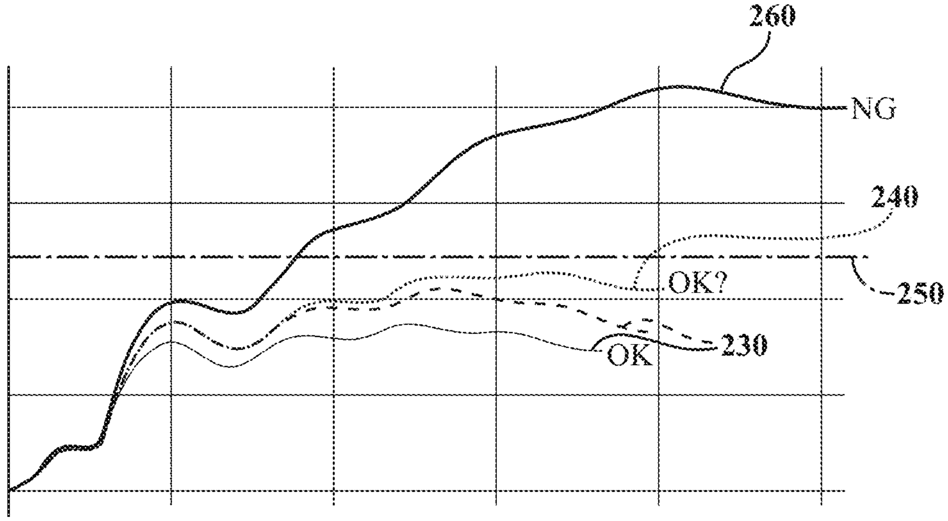

Turning to FIGS. 2A and 2B, examples of detecting plating, measuring a health state, and predicting a residual value and a reuse value for the used battery are illustrated. The estimation system 100 may compute one or more of the following first derivatives using impedance measurements from the used battery associated with identifying the reuse value: a first derivative of a real-part from an impedance value, a first derivative of an imaginary-part from the impedance value, a difference between real-parts from first derivatives of impedance values among two frequency points, a difference between imaginary-parts from first derivatives of impedance values among the two frequency points, the real-part of the impedance value, and the imaginary-part of the impedance value. The two frequency points can be the variable frequencies $f_1$ to $f_2$ within a frequency band exhibiting increased chemical breakdown and an ion response associated with the used battery. This allows the estimation system 100 to reliably and non-invasively detect internal degradation and plating using first derivative computations at a module level.

Although examples reference two frequency points, any number of frequency points may be used for impedance computations described herein. Furthermore, derivative computations can proceed upon filtering impedance measurements for noise by intelligently selecting the frequency band through accounting for battery architectures and profiles. The first derivative is also an advantageous, efficient, and low-cost approach for filtering high-frequency interference from sources described below. Unlike the second derivative, the first derivative is noise-resistant for certain interference types.

The estimation system 100 may measure impedance at target temperatures and SOCs that improve the effectiveness of detecting degradation and computing a residual value using first derivative computations. Target temperatures and SOCs can depend upon the internal architecture and chemistry of a used battery. Furthermore, the first derivative of the real-parts from impedance exhibits properties that allow the estimation system 100 to target metal deposition and degradation (e.g., a chemical degradation, a physical degradation, etc.) through mitigating interference sources. This allows the estimation system 100 to accurately compute a SOF for the used battery during testing from the interference sources associated with one of a cell, a module, a cell array, etc., within the used battery.

In various implementations, the estimation system 100 detects internal degradation of one of a battery cell and a module and computes the residual value externally, thereby avoiding invasive, destructive, and complex tasks during testing that demand disassembly. In particular, the first derivative can nullify, eliminate, remove, mitigate, etc., contact interference for the used battery during impedance measurements at selected frequency bands. Contact interference (e.g., iron contacts, copper contacts, etc.) may originate from internal cells within a battery module experiencing a loosening, tightening, etc., for a coupling between terminals, contact tabs, etc., and exhibit frequency independence.

Computations with the estimation system 100 can include using a difference between the real-parts from the first derivatives of the impedance values among the two frequency points This task can nullify, mitigate, eliminate, remove, etc., inductive interference (e.g., iron-based induction). Here, inductive interference from iron is an interference source and a contact interference associated with one of a cell, a module, a cell array, etc., within the used battery represents another interference source.

In an embodiment, the estimation system 100 converting real-parts of impedance to a percentage value can further minimize inductive interference (e.g., eddy current) when detecting degradation and computing a residual value and identifying a reuse value. For example, this approach emphasizes changes caused from metallic plating through observing linear relationships and reducing computations through monotonically increasing relationships rather than higher-order tasks. Furthermore, in another embodiment, the estimation system 100 factors context parameters and the difference between real-parts from first derivatives of impedance values among multiple frequency points (e.g., two) when selecting a threshold for the safety state. The first derivatives can be compared against the threshold to gauge a degradation level.

The estimation system 100 analyzing the residual value can diagnose other defects besides internal degradation, plating, etc. In one approach, the threshold is associated with a plating level involving a particular battery chemistry (e.g., lithium-ion), usage profile (e.g., harsh weather, rough terrain, aggressive driving, etc.), etc. In this way, the estimation system 100 increases the reliability and accuracy of the safety state, the residual value, and the reuse value outputs through intelligently selecting the threshold.

In another approach, the estimation system 100 estimates one of a safety state, a SOF, and the physical degradation for the used battery through computing eddy interference. Here, the estimation system 100 can utilize a linear relationship derived from first derivatives of real-parts associated with impedance measurements. This allows the estimation system 100 to diagnose the physical degradation as one of material wear, SEI growth, and an eddy current from inductive interference while avoiding complex testing tasks and specialized equipment. This can include the estimation system 100 computing eddy interference for the interference sources using a linear relationship derived from the first derivatives of real-parts associated with measured impedance. In this regard, the estimation system 100 can identify plating of a terminal within the used battery by comparing a difference between multiple values (e.g., two) of a first derivative within the frequency band with a threshold, and use the testing equipment to identify the plating without disassembling cells associated with the used battery and calculate the safety state using a degree of the plating.

In certain examples given herein, the estimation system 100 identifies plating of a terminal within the used battery from a difference between two values of a first derivative within the frequency band using the testing equipment without disassembling cells associated with the used battery. As previously explained, the estimation system 100 can compute a safety state and derive a reuse value for the used battery without impedance tracking from a timepoint that the used battery is manufactured using a cycling parameter. For instance, the cycling parameter represents a number of cycles and extreme operating temperatures experienced by the used battery. In this way, the estimation system 100 can output a safety state and a residual value about the used battery that indicates an available degree of the used battery being a power source in a reuse application.

Now discussing FIG. 2A, the estimation system 100 can observe and compute changes of first derivatives for real-parts between various interference sources $\mathbf{210_1}$-$\mathbf{210_3}$ across different frequencies associated with impedance measurements acquired from the measurement module 130. Here, testing equipment can non-invasively acquire impedance measurements externally at a module level from a used battery pack for computations by the estimation system 100. In this way, the estimation system 100 avoids disassembly-related damage when accessing battery cells for measuring the interference sources $\mathbf{210_1}$-$\mathbf{210_3}$.

In FIG. 2A, the interference source $\mathbf{210_1}$ may represent plating associated with one of a cell, a module, etc., within a used battery. Meanwhile, the interference source $\mathbf{210_2}$ can represent contact interference, contact interference plating, etc., associated with one of a battery module, a cell, etc. Here, contact interference can originate from internal cells within a battery module experiencing a loosening, tightening, etc., for a coupling between terminals. The interference source $\mathbf{210_3}$ can represent a metal material external to the used battery impacting one of a battery module, a cell, etc., within the used battery. In these examples, the impedance changes of the first derivatives for the real-parts between two or more frequency points can indicate an interference source and related degrees. In a further approach, the estimation system 100 for the Y-axis in 220 can convert to a percentage value. As previously described, this allows the estimation system 100 to further minimize contact interference and emphasizes impedance changes from metallic plating (e.g., Li-plating) for improved plating detection and identifying a resale cost.

Discussing FIG. 2B, raw values of first derivatives for real-parts from impedance measurements using testing equipment and deriving a remaining capacity is illustrated. Here, the y-axis can be a unitless safety level predicted by the estimation system 100 about a used battery, such as while avoiding visual inspection of a cell. A reuse value can be dependent upon the remaining capacity and sensitive to the safety level. In FIG. 2B, the estimation system 100 and the measurement module 130 derive the raw values from various batteries and compare the first derivative values for the real-parts against a threshold 250. As previously explained, the estimation system 100 can acquire and retrieve context parameters about a used battery and factor the context parameters and the difference between real-parts from first derivatives of impedance values when selecting a threshold.

The threshold 250 can indicate degrees when the safety state and the residual value allow a reuse application for the used battery. As such, the threshold 250 can be a plating level associated with one of a battery chemistry (e.g., lithium-ion), a usage profile (e.g., harsh weather, aggressive driving, etc.), etc. In turn, the estimation system 100 can compute the resale costs through factoring and weighting this information about the threshold 250, the safety state, and the residual value.

As an example, the raw values over time for batteries 230 remain below the threshold 250 indicating that the batteries 230 have elevated residual values. The batteries 230 are also likely free from plating. As such, systems have opportunities for reusing used batteries in diverse applications.

Battery 240 can be available for reuse outside of mission-critical applications (e.g., vehicles) since the first derivative values for real-parts from impedance are near the threshold 250. This can also indicate a residual value that is limited and potential plating internally that goes undetected. Furthermore, the output of the estimation system 100 can indicate recycling battery 260 since the raw values of first derivative values are above the threshold 250. Here, the battery 260 may have one or more cells with metallic plating and other degradation (e.g., a chemical degradation, a physical degradation, etc.) to a degree that makes reuse impractical and unsafe. The estimation system 100 can also predict that the battery 260 has a minimal residual value for reuse applications.

Figure 3A:
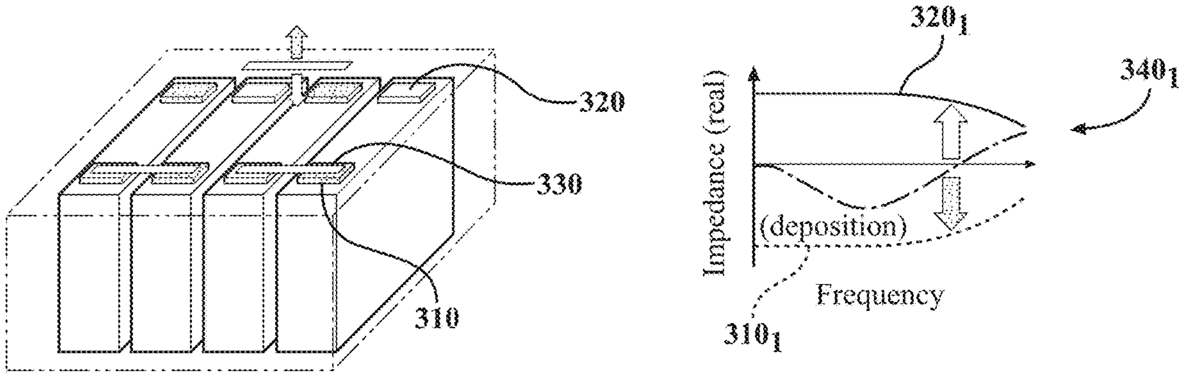
FIGS. 3A and 3B illustrate examples of interference sources the estimation system can mitigate and remove when deriving the residual and reuse values using first derivative computations.
Figure 3B:
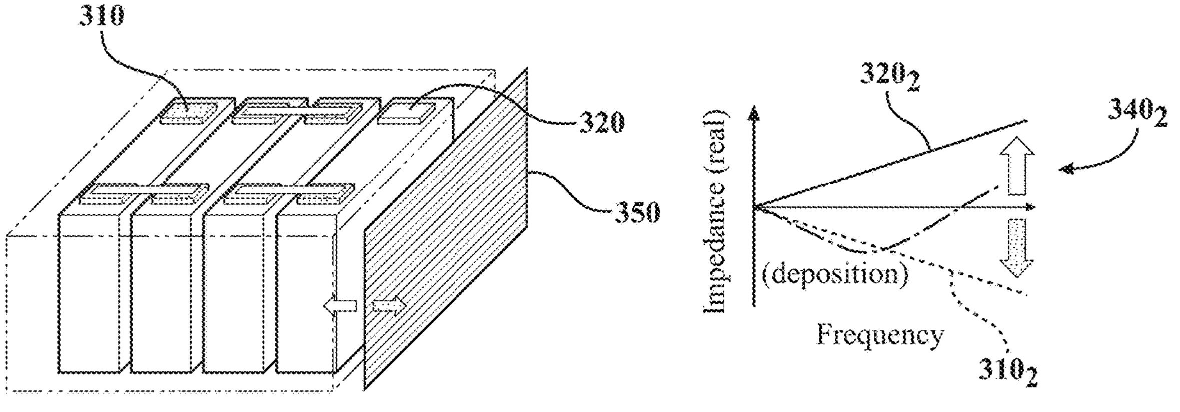

For FIGS. 3A and 3B, examples of interference sources the estimation system 100 can mitigate and remove using first derivative computations are illustrated. The estimation system 100 can target predicting one of metal deposition and a safety state and a reuse value through mitigating interference sources for a used battery. This can involve testing the used battery and computing the first derivative of the real-parts from the measured impedance. Furthermore, safety state testing can involve extracting operating qualities over certain safety-related features associated with the used battery (e.g., SOC, temperature, induction, etc.).

The examples in FIGS. 3A and 3B involve interference sources associated with one of a cell, a module, a cell array, etc., within the used battery. Here, the estimation system 100 can avoid invasive and complex testing through the first derivative computations detecting the interference sources for internal cells externally at a module level. Furthermore, the estimation system 100 measuring impedance at target temperatures and SOCs exhibiting increased chemical reactivity can improve the effectiveness of detecting degradation (e.g., a chemical degradation, a physical degradation, etc.), a residual value, and a resale value using first derivative computations. For instance, the SOC target depends upon an internal architecture and chemistry of the used battery. As previously described, the estimation system 100 can factor SOC and adapt a target for reuse applications and resale computations when testing the used battery, thereby further improving operational accuracy.

Computing the first derivative also nullifies, mitigates, eliminates, removes, etc., contact interference for a used battery during impedance measurements involving selected frequency bands. Contact interference may be from internal cells within a battery module experiencing a loosening, tightening, etc., for a coupling between terminals. This can be readily measurable within a frequency band. In FIG. 3A, in one embodiment, the estimation system 100 mitigates contact interference when measuring impedance from the used battery. Here, the used battery has a negative terminal 310 and a positive terminal 320 between internal cells, modules, etc., as contact tabs. As previously explained, contact interference may originate from the internal cells within a battery module experiencing a loosening, tightening, etc., for a coupling 330 between terminals, contact tabs, etc. The estimation system 100 can encounter reduced accuracy to impedance measurements from contact interference. Thus, the estimation system 100 improves accuracy and reliability for detecting battery degradation and estimating a residual value, a safety state, and a reuse value through the first derivative removing contact interference for the used battery during impedance measurements.

FIG. 3A can also include the estimation system 100 converting real-parts of impedance to a percentage value for minimizing inductive interference from eddy currents. This conversion can magnify changes caused from metallic plating through observing linear relationships. Another benefit from the technique is reducing computational complexity with monotonically increasing relationships and avoiding higher-order computations. Furthermore, the estimation system 100 and the measurement module 130 can naturally filter wear interference and measurement noise (e.g., sensor interference) to a used battery by targeting certain frequency bands during measurements. In this regard, factoring the specific structure of the used battery can help targeting these frequency bands. For instance, impedance measurements by the estimation system 100 are impacted by the used battery having one of cylindrically rolled cells, stacked plates, etc., below a certain frequency. As such, the estimation system 100 measuring above the certain frequency can remove the wear and aging interference through factoring battery structure.

As previously described, the estimation system 100 relates battery chemistries with measurement frequencies. Certain battery chemistries have operating limits that impact interference sources. In one embodiment, the operating limit is 100 kHz for lithium-ion batteries. As such, the contact and inductive interference from iron sources may be most prominent and magnified at or above 100 kHz. The estimation system 100 can account for this phenomenon by filtering irrelevant interference sources and targeting certain interference sources by impedance measurements above certain frequencies and computing the first derivative from the measurement curve over different frequency points.

FIG. 3B illustrates that changes between the real-parts from the first derivatives of the impedance values among multiple (e.g., two) frequency points can nullify, mitigate, eliminate, remove, etc., inductive interference (e.g., iron-based induction). In one approach, an external object 350 that is metallic, magnetic, etc., causes inductive interference with internal cells, modules, a cell array, etc., of a used battery during impedance measurements. Here, the internal cells may comprise aluminum, stainless steel, etc., material that inductively couples with the external object 350. The coupling may occur even with polymers, plastic, etc., forming the housing and shielding the used battery. As such, the estimation system 100 removing inductive interference can improve computations for one of a safety state, a residual value, and a reuse value including wear-related defects.

Charts $340_1$ and $340_2$ illustrate relationships between real-parts of impedance measurements with deposition on a cell contact (e.g., metallic plating). Here, curves $320_1$ and $320_2$ represent the real impedance for the positive terminal 320. Similarly, curves $310_1$ and $310_2$ represent the real impedance for the negative terminal 310. As shown in charts $340_1$ and $340_2$, internal and external factors that may change impedance appear as interference against degradation (e.g., plating) and SOH estimation. As such, the estimation system 100 computing derivatives allows removal of the impedance change caused by contact interference, inductive interference (e.g., iron-based induction), etc., to accurately estimate a safety state, SOS, etc., and a corresponding resale value. Furthermore, removing and mitigating certain interferences allows the estimation system 100 to estimate SOS since the impedance change caused by SOS may be comparatively less, smaller, etc., than certain interference sources.

In another example, deposition from contact interference has first derivative values that are noticeable in chart $340_1$ at a higher frequency than in chart $340_2$. Furthermore, inductive interference from an external object that has iron and exhibits magnetic properties has constant first derivatives. As such, the estimation system 100 can reliably detect deposition, a safety state, and a residual value above a frequency, above a certain frequency, etc., that magnifies degradation and plating for a used battery, thereby improving accuracy.

The estimation system 100 includes additional enhancements for predicting a residual value, a safety state, and a reuse value from an impedance measurement and a health state. As previously explained, in one example, the estimation system 100 measures the health state using the sensor data 170 about the used battery acquired with the testing equipment. Here, the sensor data 170 can include an output voltage, an operating temperature, and the impedance at reduced temperatures. Furthermore, the safety state satisfying a parameter (e.g., ion deposition, contact thickness, etc.) can include labeling a characteristic of the safety state as one of material wear and an eddy current from inductive interference. In one approach, the material wear includes SEI growth on a battery cell associated with the used battery. Therefore, the estimation system 100 can accurately estimate a reuse value from one of the safety state and residual value of cells within the used battery using the real values of the first derivative non-invasively.

Figure 4:
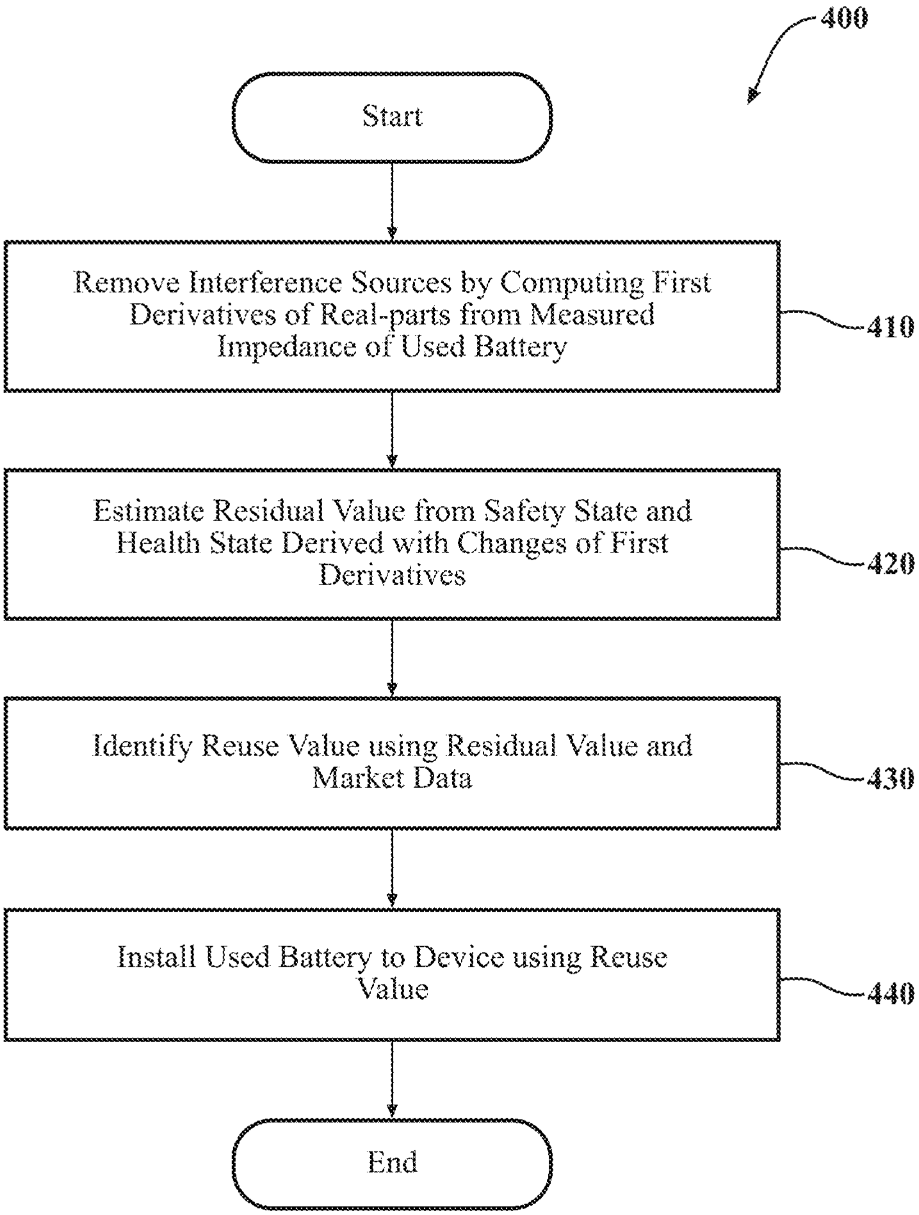
FIG. 4 illustrates one embodiment of a method that is associated with identifying the reuse value about the used battery using the residual value and market data.

Now discussing FIG. 4, one embodiment of a method 400 that is associated with identifying the reuse value about a used battery using a residual value and market data is illustrated. The method 400 will be discussed from the perspective of the estimation system 100 of FIG. 1. While the method 400 is discussed in combination with the estimation system 100, it should be appreciated that the method 400 is not limited to being implemented within the estimation system 100 but is instead one example of a system that may implement the method 400.

At 410, the estimation system 100 and the measurement module 130 remove interference sources by computing first derivatives of real-parts from a measured impedance of a used battery. Here, the measurement module 130 can measure impedance using the sensor data 170 about the used battery observed and acquired with testing equipment. In another approach, the estimation system 100 measures impedance at one of target temperatures, SOC parameters, and frequency bands. The first derivative is an advantageous, efficient, and low-cost approach for filtering high-frequency interference from sources described above. Unlike the second derivative, the first derivative is noise-resistant for certain interference types. This improves the effectiveness of plating detection, computing a safety state, and deriving a residual value using first derivative computations.

As previously explained, parametric targets can depend upon the internal architecture, cell layout (e.g., stacked layers, parallel, rolled cells, etc.), and a chemistry profile of the used battery. Similarly, the estimation system 100 may select a frequency band according to a cell layout and internal architecture (e.g., cylindrical cells, stacked sheets, etc.) of a used battery. Furthermore, the estimation system 100 and the measurement module 130 can filter wear interference and measurement noise (e.g., sensor interference) to the used battery using the frequency band. Upon this point, the computation can involve one or more of the following first derivatives using impedance measurements associated with identifying the reuse value: a first derivative of a real-part from an impedance value, a difference between real-parts from first derivatives of impedance values among two frequency points, and the real-part of the impedance value. The two frequency points can be the variable frequencies $f_1$ to $f_2$ within a frequency band exhibiting increased chemical breakdown and an ion response associated with the used battery.

In other respects, the first derivative of the real-parts from impedance exhibits properties that allow the estimation system 100 to target metal deposition and degradation (e.g., a chemical degradation, a physical degradation, etc.) through mitigating interference sources. As previously explained, interference sources can be one of inductive interference from an eddy current, inductive interference from iron, contact interference, and aging interference. Utilizing first derivative computations allows the estimation system 100 to accurately detect plating and compute a safety state for the used battery during testing from the interference sources associated with one of a cell, a module, a cell array, etc., within the used battery non-invasively while reducing computational complexity.

At 420, the estimation system 100 estimates a residual value from a safety state and a health state derived with changes of first derivatives. The residual value, in one embodiment, is one of a state of functionality and a SOF associated with the used battery. This can include the residual value indicating a degree of the used battery available as a power source in a reuse application. Meanwhile, the safety state may indicate plating within a cell of a module internal to the used battery.

The residual value exceeding, satisfying, etc., a threshold can indicate that one or more cells within the used battery exhibit sparse plating, or lack metallic plating. This indication increases opportunities for reuse and resale rather than recycling and creating waste. Otherwise, the used battery has limited market value and the used battery should be recycled when the residual value indicates that the used battery is unsuitable and unsafe for reuse opportunities.

The residual value can have different degrees that indicate available applications for reuse and improve reuse value estimates. For instance, an average residual value and market value can indicate that the used battery can be reliably used as a backup source for a building, (e.g., a warehouse, a house, etc.). Furthermore, the residual value can be associated with a SOH and SOS. For example, a weighting factor can depend upon one of a battery chemistry, a cellular structure, casing material, application environment, usage environment (e.g., commercial backup, an electric vehicle), etc. As such, the weighting factor improves reuse and resale determinations by incorporating and factoring additional context for the used battery. This can include the estimation system 100 computing the residual value for the used battery using the safety state and the weighting factor, and the SOH.

At 430, the estimation system 100 identifies a reuse value using the residual value and market data. Here, the reuse value 150 can be a resale price, a resale value, a resale cost, etc., associated with the used battery. Furthermore, deriving the market data can involve the estimation system 100 collecting usage data, resale trends, etc., about multiple batteries after a primary use. As previously explained, the estimation system 100 can output the market data using the usage data and factor the data for computing a relative reuse value.

At 440, the estimation system 100 in conjunction with a downstream system installs the used battery to a device using the reuse value. In one approach, a reuse application having reduced demands for one of safety, QoS, and environmental pressures for a used battery accepts cells exhibiting minimal plating. Here, the system installs the used battery with an average reuse value. Another reuse case involving a critical application can demand the residual value that is elevated for the used battery. For example, a critical application is the used battery being a main power source for a traction battery associated with a vehicle, hospitals, powering medical equipment, a power source for a chemical plant, etc. Accordingly, downstream systems can rely upon the residual value, safety states, and reuse values for determining different installation options involving the used battery in a device, thereby expanding reuse applications.

Detailed embodiments are disclosed herein. However, it is to be understood that the disclosed embodiments are intended as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Furthermore, the terms and phrases used herein are not intended to be limiting but rather to provide an understandable description of possible implementations. Various embodiments are shown in FIGS. 1-4, but the embodiments are not limited to the illustrated structure or application.

The flowcharts and block diagrams in the figures illustrate the architecture, functionality, and operation of possible implementations of systems, methods, and computer program products according to various embodiments. In this regard, a block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components, and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein.

The systems, components, and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a ROM, an EPROM or flash memory, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Generally, modules as used herein include routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an ASIC, a hardware component of a system on a chip (SoC), as a programmable logic array (PLA), or as another suitable hardware component that is embedded with a defined configuration set (e.g., instructions) for performing the disclosed functions.

Program code embodied on a computer-readable medium may be transmitted using any appropriate medium, including but not limited to wireless, wireline, optical fiber, cable, radio frequency (RF), etc., or any suitable combination of the foregoing. Computer program code for carrying out operations for aspects of the present arrangements may be written in any combination of one or more programming languages, including an object-oriented programming language such as Java™, Smalltalk™, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all combinations of one or more of the associated listed items. As an example, the phrase "at least one of A, B, and C" includes A, B, C, or any combination thereof (e.g., AB, AC, BC, or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. An estimation system comprising:
a memory storing instructions that, when executed by a processor, cause the processor to:
measure impedance using testing equipment externally coupled with a battery module of a used battery acquiring data from an internal sensor of the battery module, the battery module having battery cells;
remove interference associated with the impedance by computing first derivatives of real-parts from the impedance;
detect plating of a terminal within the used battery using the testing equipment by comparing a difference between two values of the first derivatives with a threshold without the testing equipment disassembling one or more of the battery cells;
estimate a residual value from a safety state and a health state derived with changes of the first derivatives;
identify a reuse value using the residual value and market data; and
assign the used battery to a device according to the reuse value.

2. The estimation system of claim 1 further including instructions to:
collect usage data about multiple batteries after primary uses, the multiple batteries include the battery module; and
output the market data using the usage data.

3. The estimation system of claim 1, wherein the instructions to estimate the residual value further include instructions to:
compute eddy interference for the interference using a linear relationship derived from the first derivatives; and
calculate the safety state using a degree of the plating independent of a visual inspection.

4. The estimation system of claim 3, wherein the instructions to assign the used battery further include instructions to:
derive the reuse value when the plating is above the threshold.

5. The estimation system of claim 1, wherein the instructions to estimate the residual value further include instructions to:
measure the health state using the data, the data including an output voltage, an operating temperature, and the impedance at multiple temperatures; and
output the residual value by multiplying values of the safety state, the health state, and a weighting factor associated with an internal structure of the used battery.

6. The estimation system of claim 1, wherein the instructions to estimate the residual value further include instructions to:
label a characteristic of the safety state as one of material wear and an eddy current from inductive interference, and the material wear includes solid electrolyte interphase (SEI) growth on one of the battery cells associated with the used battery.

7. The estimation system of claim 1, wherein,
the health state is a state of health (SOH) that indicates one of a remaining capacity and a charging capacity of the used battery; and
the residual value is one of a state of functionality and a state of function (SOF) associated with the used battery and the residual value indicates a degree of the used battery available as a power source in a reuse application.

8. The estimation system of claim 1, wherein:
the interference is an inductive interference from iron and a contact interference associated with one of the battery cells and the battery module within the used battery.

9. A non-transitory computer-readable medium comprising:

instructions that when executed by a processor cause the processor to:

measure impedance using testing equipment externally coupled with a battery module of a used battery acquiring data from an internal sensor of the battery module, the battery module having battery cells;

remove interference associated with the impedance by computing first derivatives of real-parts from the impedance;

detect plating of a terminal within the used battery using the testing equipment by comparing a difference between two values of the first derivatives with a threshold without the testing equipment disassembling one or more of the battery cells;

estimate a residual value from a safety state and a health state derived with changes of the first derivatives;

identify a reuse value using the residual value and market data; and assign the used battery to a device according to the reuse value.

10. The non-transitory computer-readable medium of claim 9 further including instructions to:

collect usage data about multiple batteries after primary uses, the multiple batteries include the battery module; and output the market data using the usage data.

11. The non-transitory computer-readable medium of claim 9, wherein the instructions to estimate the residual value further include instructions to:

compute eddy interference for the interference using a linear relationship derived from the first derivatives; and calculate the safety state using a degree of the plating independent of a visual inspection.

12. The non-transitory computer-readable medium of claim 11, wherein the instructions to assign the used battery further include instructions to:

derive the reuse value when the plating is above the threshold.

13. A method comprising:

measuring impedance using testing equipment externally coupled with a battery module of a used battery acquiring data from an internal sensor of the battery module, the battery module having battery cells;

removing interference associated with the impedance by computing first derivatives of real-parts from the impedance;

detecting plating of a terminal within the used battery using the testing equipment by comparing a difference between two values of the first derivatives with a threshold without the testing equipment disassembling one or more of the battery cells;

estimating a residual value from a safety state and a health state derived with changes of the first derivatives;

identifying a reuse value using the residual value and market data; and installing assigning the used battery to a device according to the reuse value.

14. The method of claim 13 further comprising:

collecting usage data about multiple batteries after primary uses, the multiple batteries include the battery module; and outputting the market data using the usage data.

15. The method of claim 13, wherein estimating the residual value further includes:

computing eddy interference for the interference sources using a linear relationship derived from the first derivatives; and calculating the safety state using a degree of the plating independent of a visual inspection.

16. The method of claim 15, wherein assigning the used battery further includes:

deriving the reuse value when the plating is above the threshold.

17. The method of claim 13, wherein estimating the residual value further includes:

measuring the health state using the data, the data including an output voltage, an operating temperature, and the impedance at multiple temperatures; and outputting the residual value by multiplying values of the safety state, the health state, and a weighting factor associated with an internal structure of the used battery.

18. The method of claim 13, wherein estimating the residual value further includes:

labeling a characteristic of the safety state as one of material wear and an eddy current from inductive interference, and the material wear includes solid electrolyte interphase (SEI) growth on one of the battery cells associated with the used battery.

19. The method of claim 13, wherein:

the health state is a state of health (SOH) that indicates one of a remaining capacity and a charging capacity of the used battery; and the residual value is one of a state of functionality and a state of function (SOF) associated with the used battery and the residual value indicates a degree of the used battery available as a power source in a reuse application.

20. The method of claim 13, wherein:

the interference is an inductive interference from iron and a contact interference associated with one of the battery cells and the battery module within the used battery.

* * * * *